United States Patent
Zeng et al.

(10) Patent No.: US 11,088,405 B2
(45) Date of Patent: Aug. 10, 2021

(54) BATTERY PACK TEMPERATURE DETECTION SYSTEM

(71) Applicant: CONTEMPORARY AMPEREX TECHNOLOGY CO., LIMITED, Ningde (CN)

(72) Inventors: Yuqun Zeng, Ningde (CN); Kai Wu, Ningde (CN); Sixia Meng, Ningde (CN); Guoxiu Wu, Ningde (CN); Qiandeng Li, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 164 days.

(21) Appl. No.: 16/548,987

(22) Filed: Aug. 23, 2019

(65) Prior Publication Data

US 2020/0088801 A1 Mar. 19, 2020

(30) Foreign Application Priority Data

Sep. 14, 2018 (CN) .......................... 201811074387.X

(51) Int. Cl.
*H01M 10/48* (2006.01)
*G01R 31/382* (2019.01)
(Continued)

(52) U.S. Cl.
CPC ........ *H01M 10/486* (2013.01); *G01R 31/382* (2019.01); *H01M 10/443* (2013.01); *H02J 7/0091* (2013.01)

(58) Field of Classification Search
CPC ...... G01K 1/026; G01K 7/22; G01K 2219/00; G01K 31/382; G01K 31/374;
(Continued)

(56) References Cited

U.S. PATENT DOCUMENTS 5,552,999 A * 9/1996 Polgreen ................. G06F 1/206
702/63
5,621,302 A * 4/1997 Shinohara ......... H02J 7/007184
320/148
(Continued)

FOREIGN PATENT DOCUMENTS

CN 103715467 A 4/2014
CN 104007391 A 8/2014
(Continued)

OTHER PUBLICATIONS

Extended European Search Report for European Patent Application No. 19193664.0 dated Feb. 7, 2020.
(Continued)

*Primary Examiner* — Helen Rossoshek
(74) *Attorney, Agent, or Firm* — Heslin Rothenberg Farley & Mesiti P.C.

(57) ABSTRACT

Disclosed is a battery pack temperature detection system, comprising: a battery pack disposed with a plurality of temperature monitoring points; a plurality of sampling circuits, wherein each temperature monitoring point is disposed with at least two of the plurality of sampling circuits, and the at least two of the plurality of sampling circuits disposed for one temperature monitoring point are different sampling circuits; and a control module configured to acquire temperature data of each temperature monitoring point by each of the disposed sampling circuits, and determine a current temperature of the battery pack according to the temperature data to determine whether the temperature of the battery pack exceeds a preset value.

10 Claims, 4 Drawing Sheets

(51) Int. Cl.
*H01M 10/44* (2006.01)
*H02J 7/00* (2006.01)

(58) Field of Classification Search
CPC .. H02J 7/0091; H01M 10/637; H01M 10/443; H01M 10/486; Y02E 60/10
See application file for complete search history.

(56) References Cited

U.S. PATENT DOCUMENTS

| | | | | |
|---|---|---|---|---|
| 6,061,528 | A * | 5/2000 | Ichihara | G03B 7/26 396/205 |
| 6,255,826 | B1 * | 7/2001 | Ohsawa | H02J 7/0047 324/426 |
| 7,803,485 | B2 * | 9/2010 | Takezawa | H01M 4/5825 429/231.95 |
| 7,972,738 | B2 * | 7/2011 | Yamamiya | H01M 8/04201 429/433 |
| 8,643,376 | B2 * | 2/2014 | Ishikawa | G01R 31/396 324/434 |
| 8,741,459 | B2 * | 6/2014 | Okumura | B60K 6/365 429/90 |
| 8,828,570 | B2 * | 9/2014 | Banerjee | H01M 50/581 429/62 |
| 9,484,565 | B2 * | 11/2016 | Miyazaki | H01M 10/0525 |
| 9,678,165 | B2 * | 6/2017 | Joe | H01M 10/48 |
| 10,005,373 | B2 * | 6/2018 | Morikawa | H02J 7/04 |
| 10,367,239 | B1 * | 7/2019 | Dao | H01M 10/625 |
| 2011/0151296 | A1 * | 6/2011 | Muraoka | H01M 10/0431 429/94 |
| 2012/0143585 | A1 * | 6/2012 | Barsukov | G01R 31/367 703/18 |
| 2012/0145468 | A1 * | 6/2012 | Pekala | H01M 10/52 180/65.31 |
| 2013/0004811 | A1 | 1/2013 | Banerjee et al. | |
| 2014/0001863 | A1 * | 1/2014 | Zhang | G21D 1/02 307/66 |
| 2014/0322600 | A1 * | 10/2014 | Morita | H01M 4/13 429/212 |
| 2015/0171489 | A1 * | 6/2015 | Inaba | G01R 31/3644 429/61 |
| 2016/0104924 | A1 * | 4/2016 | Kamijoh | H01M 10/613 429/62 |
| 2017/0010332 | A1 * | 1/2017 | Kagami | G01R 31/392 |
| 2017/0092922 | A1 * | 3/2017 | Hommura | H01M 10/0525 |
| 2017/0149256 | A1 * | 5/2017 | Srinivasan | H01M 10/486 |
| 2017/0179547 | A1 * | 6/2017 | Zhang | H01M 10/443 |
| 2017/0179550 | A1 * | 6/2017 | Tanigawa | G01K 7/24 |
| 2017/0279167 | A1 * | 9/2017 | Herrema | G01F 23/263 |
| 2018/0262017 | A1 * | 9/2018 | Hsu | H02J 7/00041 |
| 2018/0364312 | A1 * | 12/2018 | Jiang | G01R 31/392 |
| 2019/0115636 | A1 * | 4/2019 | Remboski | G01R 31/3842 |
| 2020/0348365 | A1 * | 11/2020 | Wang | H01M 10/48 |
| 2020/0350770 | A1 * | 11/2020 | Dan | H01M 10/486 |

FOREIGN PATENT DOCUMENTS

| | | | |
|---|---|---|---|
| CN | 104795604 A | 7/2015 | |
| CN | 107007391 A | 8/2017 | |
| CN | 107664542 A | 2/2018 | |
| CN | 206960628 U | 2/2018 | |
| CN | 108120938 A | 6/2018 | |
| DE | 102014200997 A1 | 7/2015 | |
| EP | 3240097 B1 * | 8/2018 | ................ H02J 7/04 |

OTHER PUBLICATIONS

Search Report for Chinese Patent Application No. 201811074387.X dated Sep. 2, 2020.
Search Report for Chinese Patent Application No. 201811074387.X dated Nov. 27, 2020.

* cited by examiner

BATTERY PACK TEMPERATURE DETECTION SYSTEM

CROSS-REFERENCE TO RELATED APPLICATION

This application claims the priority benefit of Chinese Patent Application No. 201811074387.X filed on Sep. 14, 2018 and entitled "BATTERY PACK TEMPERATURE DETECTION SYSTEM", the disclosure of which is incorporated by reference herein in its entirety.

TECHNICAL FIELD

The present disclosure relates to the field of battery technology, especially a battery pack temperature detection system.

BACKGROUND

Being new energy vehicles, electric vehicles are rapidly developing, drawing increasing attention from users concerned about safety issues of electric vehicles. As a source of power driving an electric motor vehicle, safety of a battery pack is directly related to safety of the entire vehicle. A battery pack can be greatly affected by temperature, and when temperature is too high, it may affect safety of the entire vehicle. Therefore, it is an important goal to prevent a battery pack from being "overheated", so as to ensure safe performance of an electric vehicle.

SUMMARY

Some embodiments of the present invention provide a battery pack temperature detection system, including: a battery pack disposed with a plurality of temperature monitoring points; a plurality of sampling circuits, wherein each temperature monitoring point is disposed with at least two of the plurality of sampling circuits, and the at least two of the plurality of sampling circuits disposed for one temperature monitoring point are different sampling circuits; a control module configured to acquire temperature data of each temperature monitoring point by each of the disposed sampling circuits, and determine a current temperature of the battery pack according to the temperature data to determine whether the temperature of the battery pack exceeds a preset value.

Compared with the existing technology, the battery pack is disposed with a plurality of temperature monitoring points and thus temperature detection coverage is increased, which is favorable for reflecting a battery pack's temperature fully and more truly. Besides, each temperature monitoring point is disposed with at least two sampling circuits and the at least two sampling circuits configured at the same temperature monitoring points are different sampling circuits. In this way, effect of failure of a single sampling circuit on the temperature detection system is reduced through a redundancy design on one hand, and on the other hand, it is favorable for reducing common cause failures and improving accuracy of temperature sampling.

Further, the sampling circuit includes a temperature sensor disposed at a temperature monitoring point and a detection circuit connected to the temperature sensor; and wherein a difference between the sampling circuits lies in that at least one of a type of the temperature sensor, a connection relationship between the temperature sensor and the detection circuit, and the detection circuit is different.

Further, the detection circuit comprises a power supply, a voltage divider unit, a filter resistor and a filter capacitor; wherein a connection relationship between the temperature sensor and the detection circuit specifically is: one terminal of the voltage divider unit and one terminal of the filter resistor are connected together and further connected to a first connecting terminal of the temperature sensor; the other terminal of the voltage divider unit is connected to the power supply, the other terminal of the filter resistor and one terminal of the filter capacitor are connected together as an output terminal of the sampling circuit, and the other terminal of the filter capacitor and a second connecting terminal of the temperature sensor are connected together and grounded; or, a connection relationship between the temperature sensor and the detection circuit specifically is: one terminal of the voltage divider unit and one terminal of the filter resistor are connected together and further connected to the first connecting terminal of the temperature sensor, and a second connecting terminal of the temperature sensor is connected to the power supply; the other terminal of the filter resistor and one terminal of the filter capacitor are connected together as an output terminal of the sampling circuit; the other terminal of the filter capacitor and the other terminal of the voltage divider unit are connected together and grounded; and wherein the control module is configured to calculate a temperature of each of the temperature monitoring points by sampling voltages of output terminals of the plurality of sampling circuits.

Further, there is at least one special monitoring point among the plurality of temperature monitoring points, each sampling circuit of the special monitoring point/points connecting at least two analog-digital conversion units in the control module; wherein all sampling circuits of any non-special monitoring point connect at least two analog-digital conversion units in the control module; and wherein the non-special monitoring point refers to any temperature monitoring point among the temperature monitoring points except the special monitoring point/points.

Further, the system further comprises: a multiplexer switch module, and the control module is configured to connect the plurality of the sampling circuits via the multiplexer switch module; and; and wherein the multiplexer switch module comprises a plurality of input ports, and each of the sampling circuits is correspondingly connected to one of the input ports.

Further, there are at least two multiplexer switch modules; wherein each sampling circuit of the special monitoring point/points connects at least two of the multiplexer switch modules respectively corresponding to different analog-digital conversion units; and wherein all sampling circuit/circuits of non-special monitoring point/points connects/connect at least two of the multiplexer switch modules corresponding to at least two of the analog-digital conversion units.

Further, the control module further comprises a processing unit; wherein the analog-digital conversion unit is configured to convert a voltage at an output terminal of the sampling circuit currently performing sampling, and send a converted voltage to the processing unit; wherein the processing unit is configured to search a pre-stored table for a temperature data corresponding to the converted voltage, and when found, serve the temperature data as a temperature data at a temperature monitoring point corresponding to the sampling circuit currently performing sampling; and the processing unit is further configured to, upon acquiring temperature data of all of the temperature monitoring points, select from the temperature data of all of the temperature monitoring points the highest temperature data as a temperature of the battery pack.

Further, the processing unit is configured to initiate a corresponding alarming solution according to an interval in which a difference between the temperature of the battery pack and the preset value falls when the temperature of the battery pack exceeds the preset value.

Further, the multiplexer switch module further comprises a power supply port for connecting the power supply, and a grounding port for grounding; and wherein the control module is configured to, when a voltage of the output terminal of the sampling circuit exceeds a preset range, compare the voltage at the output terminal of the sampling circuit with a voltage of a grounding port and a voltage of the power supply port of the multiplexer switch module corresponding to the sampling circuit, to determine whether a preset fault exists in the sampling circuit.

Further, the plurality of temperature monitoring points comprise a temperature monitoring point at a positive electrode of the battery pack, a temperature monitoring point at a negative electrode of the battery pack and a temperature monitoring point in a region between the positive and negative electrodes.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

The embodiments of the present disclosure will be described in detail below with reference to the accompanying drawings in order to make the objects, technical solutions and advantages of the present disclosure clearer. However, it will be apparent to those skilled in the art that, in the various embodiments of the present disclosure, numerous technical details are set forth in order to provide the reader with a better understanding of the present application. However, the technical solutions claimed in the present application may be implemented without these technical details and various changes and modifications based on the following embodiments.

The inventors found during the invention process that, in the existing technologies, one or two testing points may generally be selected randomly on a battery pack, and a temperature sensor is disposed at each testing point. Temperature at the testing point/points is sampled in real time by the temperature sensor to monitor temperature of the battery pack. Two defects exist in this monitoring method. For one thing, if there is one testing point, the battery pack temperature can not be monitored normally once a fault occurs to the sampling circuit, and there is a high rate of faults. For another, if there are two testing points, a fault occurs to a sampling circuit corresponding to one testing point may cause large temperature difference between the two testing points; in this case, it is impossible for the monitoring system to distinguish whether the large temperature difference between the two testing points is because an increased temperature occurs to one of the testing points or because a fault occurs to the sampling circuit. Therefore, it would be difficult for the above-described battery pack monitoring solution to achieve a safety goal of monitoring and diagnosing "over-temperature".

In view of this, some embodiments of the present disclosure are directed to provide a battery pack temperature detection system, which may reflect temperature of a battery pack more truly, reduce circuit failure's effect on the temperature detection system and reduce failure rate.

Figure 1:
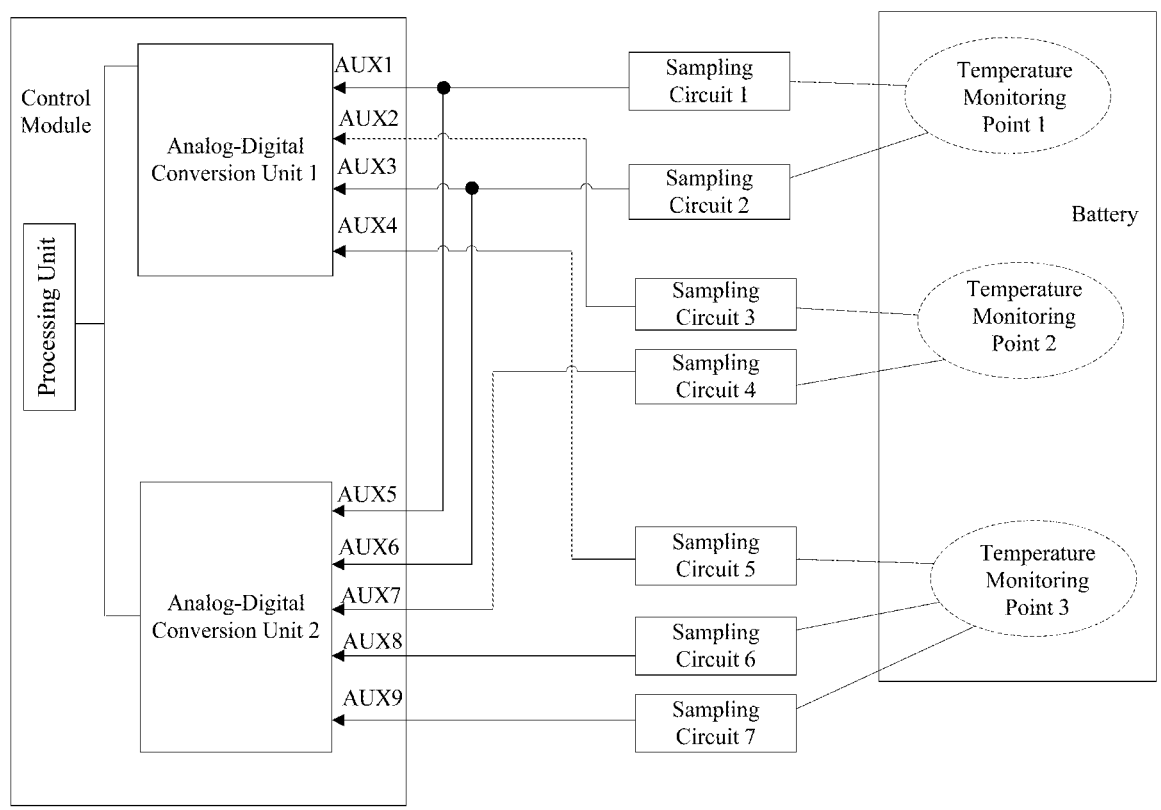
FIG. 1 is a schematic diagram showing a structure of a battery pack temperature detection system according to the present disclosure.

Some embodiments of the present disclosure relates to a battery pack temperature detection system. As shown in FIG. 1, the system includes a battery pack, a plurality of sampling circuits (sampling circuit 1 to sampling circuit 7) and a control module. The control module may acquire temperature of the battery pack through the plurality of sampling circuits.

Specifically, in the system, a plurality of temperature monitoring points may be disposed randomly on a battery pack in advance. However, considering that temperatures may differ from each other at varied parts (for example, a temperature at a positive electrode of a battery pack is generally higher than a temperature at a negative electrode of a battery pack) when the battery pack is working, the plurality of temperature monitoring points may at least include a temperature monitoring point at the positive electrode of the battery pack, a temperature monitoring point at the negative electrode of the battery pack and a temperature monitoring point at a region between the positive and negative electrodes in some embodiments, so as to represent a real temperature of the battery pack fully and more accurately. That is, at least each of the positive electrode, the negative electrode of the battery pack and the region between the positive and negative electrodes shall be disposed with one temperature monitoring point respectively. However, this embodiment is not limited hereto. In practical applications, number and positions of temperature monitoring points may be disposed as below. For example, it is feasible to dispose monitoring points only at the positive and negative electrodes of the battery pack, or dispose a plurality of monitoring points only at the region between the positive and negative electrodes, however, the present disclosure is not limited thereto.

It shall be noted that FIG. 1 shows that three temperature monitoring points, i.e., a temperature monitoring point 1, a temperature monitoring point 2 and a temperature monitoring point 3, are disposed for the battery pack as an example. The temperature monitoring point 1 represents a temperature monitoring point at the positive electrode of the battery pack, the temperature monitoring point 2 represents a temperature monitoring point at the region between positive and negative electrodes of the battery pack, and the temperature monitoring point 3 represents a temperature monitoring point at the negative electrode of the battery pack.

At least two sampling circuits may be configured for each temperature monitoring point, and the at least two sampling circuits configured for the same temperature monitoring point are different sampling circuits. Specifically, a sampling circuit includes a temperature sensor T (such as an NTC thermistor, or a PTC thermistor, etc.) disposed at the temperature monitoring point and a detection circuit connected to the temperature sensor T. Difference between the sampling circuits lies in that at least one of the three of the type of the temperature sensor, the connection relationship between the temperature sensor and the detection circuit, and the detection circuit is different. Configuring different sampling circuits for the same temperature monitoring point may, on one hand, prevent the risk of false alarms caused by failure of a single sampling circuit, and on the other hand, reduce common cause failure problems and improve accuracy of temperature sampling. It is worth mentioning that FIG. 1 shows that the temperature monitoring point 1 and the temperature monitoring point 2 correspond to two sampling circuits respectively, and the temperature monitoring point 3 corresponds to three sampling circuits as an example for description.

Figure 2A:
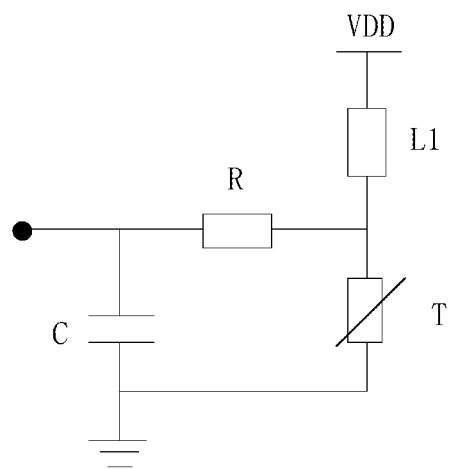
FIGS. 2a and 2b are schematic diagrams showing two structures of a sampling circuit according to the present disclosure.

It is taken as an example that the detection circuit includes a power supply VDD (which is the positive electrode of the power supply), a voltage divider unit L1, a filter resistor R, and a filter capacitor C for description. As shown in FIG. 2a, in one example, a connection relationship between the temperature sensor T and the detection circuit may specifically be: one terminal of the voltage divider unit L1 and one terminal of the filter resistor R are connected together and further connected to a first connecting terminal of the temperature sensor T; the other terminal of the voltage divider unit L1 is connected to the power supply VDD, the other terminal of the filter resistor R and one terminal of the filter capacitor C are connected together as an output terminal of the sampling circuit for connecting to the control module; and the other terminal of the filter capacitor C and a second connecting terminal of the temperature sensor T are connected together and grounded, the ground is a negative electrode of the power supply.

Figure 2B:
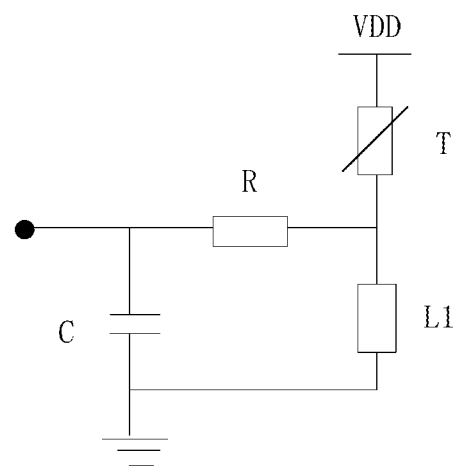

As shown in FIG. 2b, in another example, the connection relationship between the temperature sensor T and the detection circuit may specifically be: one terminal of the voltage divider unit L1 and one terminal of the filter resistor R are connected together and further connected to the first connecting terminal of the temperature sensor T, and a second connecting terminal of the temperature sensor T is connected to the power supply VDD; the other terminal of the filter resistor R and one terminal of the filter capacitor C are connected together as the output terminal of the sampling circuit for connecting the control module; the other terminal of the filter capacitor C and the other terminal of the voltage divider unit L1 are connected together and grounded.

In a case where the same temperature sensor T is selected, the sampling circuit illustrated in FIG. 2a has a sampling accuracy different from the sampling accuracy of the sampling circuit illustrated in 2b. In general, the sampling circuit in FIG. 2a has a better accuracy when it samples a temperature above 25° C., while the sampling circuit in FIG. 2b has a better accuracy when it samples a temperature below 25° C. Therefore, if two sampling circuits 2a and 2b are simultaneously configured at the same temperature testing point, it is advantageous to improve their temperature sampling accuracies. If two sampling circuits as shown in FIG. 2a are configured at the same temperature testing point (or two sampling circuits as shown in FIG. 2b are configured at the same time), and the two sampling circuits use different temperature sensors T, it is favorable for reducing common cause failures of the two temperature sensors T.

In practical applications, a sampling circuit to be configured may be selected for each temperature monitoring point. For example, for the temperature monitoring point 1, if it is necessary to reduce the rate of temperature common cause failures, the corresponding sampling circuit 1 and sampling circuit 2 may both adopt the sampling circuit as shown in FIG. 2a (or both adopt the sampling circuit as shown in FIG. 2b), and different temperature sensors T are selected for the sampling circuit 1 and the sampling circuit 2. For the temperature monitoring point 3, if it is necessary to improve the sampling accuracy, any two of the corresponding sampling circuit 5, the corresponding sampling circuit 6 and the corresponding sampling circuit 7 shall be sampling circuits as shown in FIGS. 2a and 2b respectively, and the same temperature sensor T shall be used for the two sampling circuits.

Figure 3A:
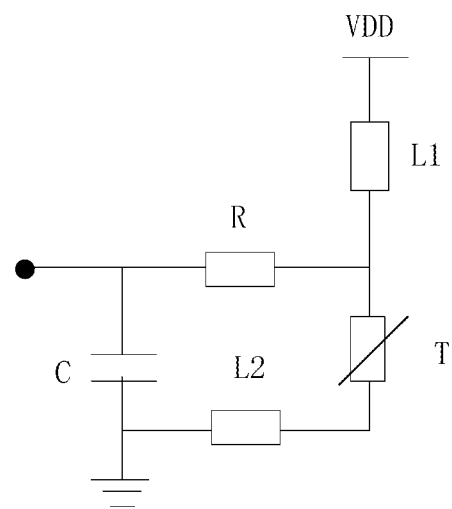
FIGS. 3a and 3b are schematic diagrams showing another two structures of a sampling circuit according to the present disclosure.
Figure 3B:
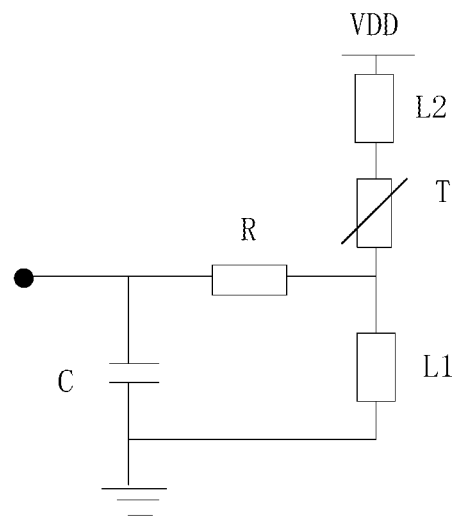

It shall be noted that the voltage divider unit L1 may be a single resistor or a resistor network formed by a plurality of resistors, however, the present disclosure is not limited thereto. In addition, in this disclosure, another voltage divider unit L2 may be connected in series in the branch where the temperature sensor T is located, as shown in FIGS. 3a and 3b. In practical application, detection accuracy may be improved by disposing a suitable voltage divider unit L1 and voltage divider unit L2, and addition of the voltage divider unit L2 is also advantageous for reducing the risk caused by a short circuit of the temperature sensor T or of the single voltage divider unit L1.

The control module acquires temperature data of each temperature monitoring point through each sampling circuit configured, and determines temperature of the current battery pack according to the acquired temperature data, so as to determine whether the temperature of the battery pack has exceeded a preset value. Specifically, the control module includes a processing unit, a plurality of analog-digital conversion units (analog-digital conversion unit 1, analog-digital conversion unit 2, . . . ) and a plurality of analog sampling interfaces (such as AUX1, AUX2, . . . in FIG. 1). The processing unit is connected to the plurality of analog-digital conversion units respectively, and each of the analog-digital conversion units corresponds to at least one analog sampling interface. Each sampling circuit may be connected to an analog sampling interface, and the analog-digital conversion unit may sample a voltage of the output terminal of the sampling circuit connected to the analog sampling interface through a corresponding analog sampling interface, and perform analog-digital conversion on the sampled voltage. Thereafter, the analog-digital conversion unit may transmit the converted voltage to the processing unit which may analyze the converted voltage through relevant application software to obtain temperature data of all temperature monitoring points. In one example, the processing unit may search a pre-stored table for a temperature data corresponding to the converted voltage. When the temperature data is found, the processing unit uses the found temperature data as a temperature data of the temperature monitoring point corresponding to the sampling circuit connected to the analog-digital conversion unit, so as to obtain the temperature data of all the temperature monitoring points.

When the processing unit acquires the temperature data of all the temperature monitoring points of the battery pack, the highest temperature data may be selected therefrom, and the highest temperature data may be taken as the temperature of the current battery pack. Afterwards, the processing unit may compare the temperature of the battery pack with the preset value to determine whether the current battery pack temperature exceeds the preset value.

In addition, when the temperature of the battery pack exceeds the preset value, the processing unit may provide different alarming solutions according to the interval in which the difference between the temperature of the battery pack and the preset value is located, so as to warn the user. For example, when the difference between the temperature of the battery pack and the preset value falls into a first interval (0 to 5° C.), the processing unit may initiate a first-level alarming solution (such as a voice alarm). When the difference between the temperature of the battery pack and the preset value falls into a second interval (greater than 5° C.), the processing unit may initiate a second-level alarming solution (e.g., to initiate a buzzer). It shall be noted that the above-described 5° C. is only an example and shall not be referred to in practice. In practical applications, ranges of intervals and alarming solutions corresponding to each of the intervals may be provided according to specific conditions, however, the present disclosure is not limited thereto.

In practical applications, a microcontroller unit (MCU) may be used to implement the control module, however, the present disclosure is not limited thereto, but the control module may otherwise be implemented by using a sampling chip that integrates an analog-digital conversion function and a data processing function and this disclosure does not impose a limitation to this.

In addition, it shall be noted that, in practical applications, at least one temperature monitoring point may be selected as a special monitoring point among a plurality of temperature monitoring points. Each sampling circuit of the special monitoring point may at least be connected to two independent analog-digital conversion units. Suppose the special monitoring point is the temperature monitoring point 1 at the positive electrode of the battery pack, the temperature monitoring point 1 corresponds to two sampling circuits, i.e., the sampling circuit 1 and the sampling circuit 2 which are different sampling circuits. Accordingly, the two different sampling circuits shall both be connected to the analog-digital conversion unit 1 and to the analog-digital conversion unit 2 (refer to FIG. 1). It is seen that for the special monitoring points, it is necessary to configure different sampling circuits for sampling to achieve vertical check; for each of the sampling circuits, different analog-digital conversion units shall be configured for sampling, which is not only advantageous for ensuring independence of sampling by the analog-digital conversion units, but may also achieve horizontal check concerning independence of sample data processing. The verifications in both horizontal and lateral directions make monitoring at the special monitoring points better, and is more likely to reduce the rate of failures. In practical applications, a temperature monitoring point at the positive electrode which is most sensitive to temperature of the battery pack may be selected as a special monitoring point, however, the present disclosure is not limited thereto, but another temperature monitoring point that needs to be focused on may be selected as the special monitoring point.

For any temperature monitoring point (i.e., a non-special monitoring point) of the plurality of temperature monitoring points except the special monitoring point, all its sampling circuits may be connected to at least two independent analog-digital conversion units. That is, at least two analog-digital conversion units sample all sampling circuits of the respective non-special monitoring point, so as to avoid connecting all sampling circuits of the respective non-special monitoring point to the same analog-digital conversion unit. Suppose the temperature monitoring point 2 is a non-special monitoring point, the temperature monitoring point 2 corresponds to a sampling circuit 3 and a sampling circuit 4, and the sampling circuit 3 and the sampling circuit 4 are different sampling circuits. Upon connection, the sampling circuit 3 and the sampling circuit 4 shall not both be connected to the analog-digital conversion unit 1, nor the sampling circuit 3 and the sampling circuit 4 both be connected to the analog-digital conversion unit 2. The sampling circuit 3 may be connected to one of the analog-digital conversion units (e.g., the analog-digital conversion unit 1, with reference to FIG. 1), while the sampling circuit 4 may be connected to the other analog-digital conversion unit (e.g., the analog-digital conversion unit 2). In this way, risk of failures may be reduced one the one hand. On the other hand, sampling by different analog-digital conversion units is favorable for ensuring independence in sampling by the analog-digital conversion units and independence in processing sample data, and the analog-digital conversion units and the sample data processing may verify each other.

Compared with the existing technology, in this disclosure, a plurality of temperature monitoring points are configured at a battery pack and temperature detection coverage is increased, which is favorable for reflecting a battery pack's temperature fully and more truly. Besides, when at least two sampling circuits are configured for each temperature monitoring point and the at least two sampling circuits configured for the same temperature monitoring points are different sampling circuits, on one hand, effect of failure of a single sampling circuit on the temperature detection system is reduced through a redundancy design, and on the other, it is favorable for reducing common cause failures and improving accuracy of temperature sampling.

The battery pack temperature detection system may further include a multiplexer switch module which enables this embodiment to be connected to a large number of sampling circuits even if there are a small number of analog sampling interfaces in the control module.

Figure 4:
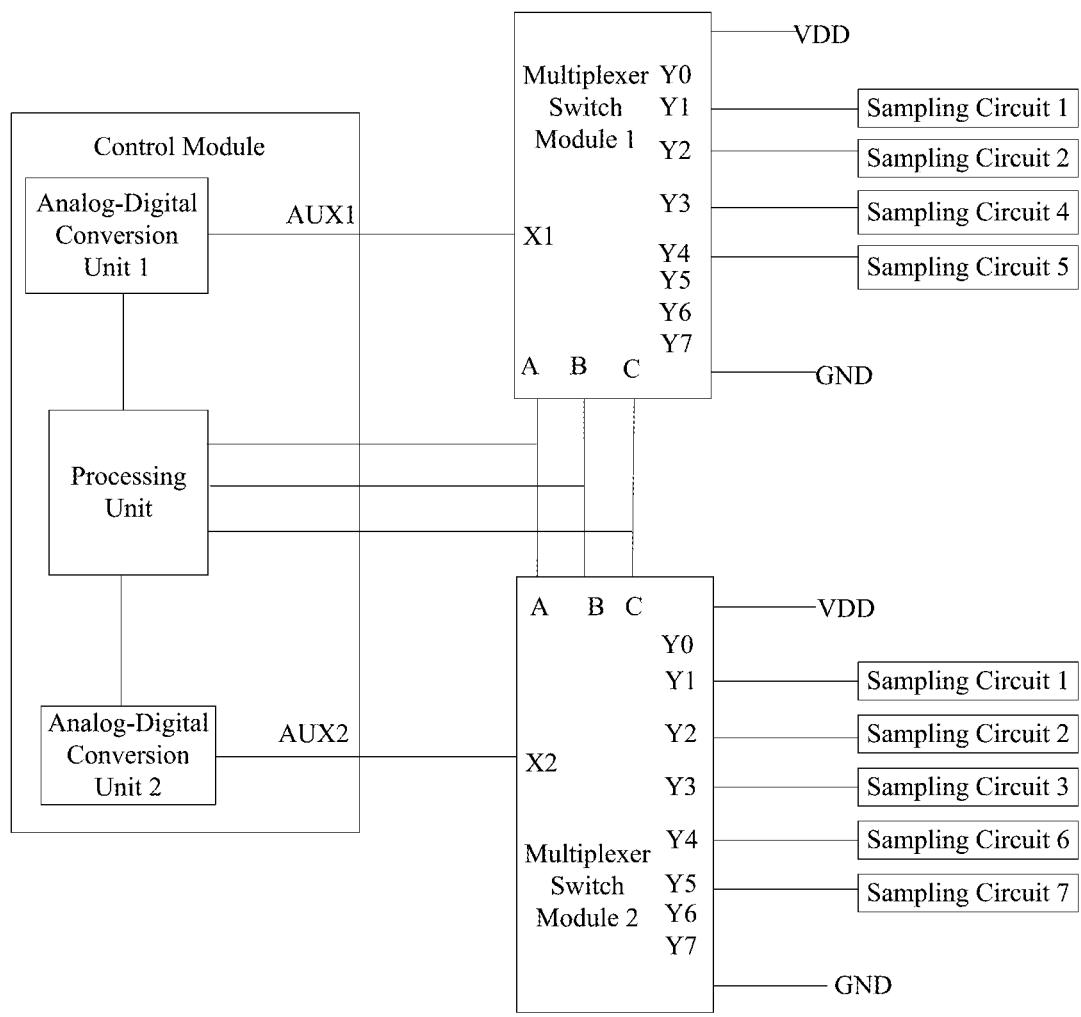
FIG. 4 is a schematic diagram showing another structure of a battery pack temperature detection system according to the present disclosure.

Specifically, the analog-digital conversion unit in the control module may be connected to the plurality of sampling circuits via the multiplexer switch module. As shown in FIG. 4, the multiplexer switch module includes: an output port (e.g., X1 and X2 in FIG. 4), a plurality of input ports (e.g., Y1, Y2 and so on in FIG. 4), and a plurality of control ports (e.g., A, B, and C in FIG. 4). Each sampling circuit may be correspondingly connected to one input port of the multiplexer switch module. Each output port of the multiplexer switch module is connected to one analog sampling interface (e.g., AUX1 and AUX2 in FIG. 4). The plurality of control ports of the multiplexer switch module are connected to the processing unit in the control module. The processing unit may select an input port currently connected with the output port by controlling signals of the plurality of control ports. It shall be noted that FIG. 4 shows that the multiplexer switch module is a 3-8-type multiplexer switch module (i.e., the module includes three control ports and eight input ports) as an example for description. In practical applications, however, other types of multiplexer switch modules (e.g., a 2-4-type multiplexer switch module) may be selected, however, the present disclosure is not limited thereto.

In order to prevent temperature sampling from failing entirely caused by failure of the multiplexer switch module, at least two multiplexer switch modules (e.g., the multiplexer switch module 1 and the multiplexer switch module 2) may be configured in this embodiment, and each analog-digital conversion unit may correspond to one or more multiplexer switch modules, however, the present disclosure is not limited thereto, but in practical applications, only one multiplexer may be provided.

In addition, at least one temperature monitoring point may be selected as a special monitoring point among the plurality of temperature monitoring points. It shall be guaranteed that each sampling circuit of the special monitoring point is connected to at least two multiplexer switch modules, and that the at least two connected multiplexer switch modules respectively correspond to different analog-digital conversion units, so that each sampling circuit of the special monitoring point corresponds to at least two independent analog-digital conversion units. Suppose the temperature monitoring point 1 at the positive electrode of the battery pack is a special monitoring point, the temperature monitoring point 1 corresponds to two sampling circuits, i.e., the sampling circuit 1 and the sampling circuit 2 which are different sampling circuits. Take the sampling circuit 1 as an example, the sampling circuit 1 shall be connected to at least two multiplexer switch modules and the at least two multiplexer switch modules shall correspond to different analog-digital conversion units. With reference to FIG. 4, the multiplexer switch module 1 in FIG. 4 corresponds to the analog-digital conversion unit 1, the multiplexer switch module 2 corresponds to the analog-digital conversion unit 2 (i.e., the multiplexer switch module 1 and the multiplexer switch module 2 correspond to different analog-digital conversion units), and the sampling circuit 1 shall be connected to the multiplexer switch module 1 and the multiplexer switch module 2 respectively. It is seen that for the special monitoring point, it is necessary to configure different sampling circuits for sampling to achieve vertical check; for each of the sampling circuits, different analog-digital conversion units shall be configured for sampling, which is not only advantageous for ensuring independence of sampling by the analog-digital conversion unit, but may also achieve horizontal check concerning the sampling circuit 1 of sample data processing. The verifications in both horizontal and lateral directions makes monitoring at the special monitoring point better, and is more likely to reduce the rate of failures.

In practical applications, a temperature monitoring point at the positive electrode which is most sensitive to temperature on the battery pack may be selected as a special monitoring point, however, the present disclosure is not limited thereto, but another temperature monitoring point that needs to be focused on may be selected as the special monitoring point.

For any temperature monitoring point (non-special monitoring point) among the plurality of temperature monitoring points except the special monitoring point, all its sampling circuits may be connected to at least two multiplexer switch modules, and the at least two multiplexer switch modules correspond to at least two independent analog-digital conversion units in the control module, so that at least two analog-digital conversion units sample all sampling circuits of the non-special monitoring point, which is favorable for ensuring independence in sampling by the analog-digital conversion units and independence in processing sample data, and the analog-digital conversion units and the sample data processing may verify each other. That is to say, on one hand, all of the sampling circuits of any non-special monitoring point shall not be connected to a same multiplexer switch module, because when all sampling circuits are connected to the same multiplexer switch module, all sampling circuits of the non-special monitoring point may only correspond to one analog-digital conversion unit because one multiplexer switch module corresponds to one analog-digital conversion unit, which may not guarantee independence in sampling by the analog-digital conversion unit or independence in sample data processing. On the other hand, when all sampling circuits of any non-special monitoring point are connected to a plurality (at least two) of multiplexer switch modules, the plurality of multiplexer switch modules shall not correspond to the same analog-digital conversion unit. Otherwise, neither the independence in sampling by the analog-digital conversion unit nor the independence in sample data processing may be guaranteed.

With reference to FIG. 4, suppose the temperature monitoring point 3 at the negative electrode of the battery pack is a non-special monitoring point, the temperature monitoring point 3 corresponds to the sampling circuit 5, the sampling circuit 6 and the sampling circuit 7 which are different sampling circuits. Accordingly, not all three of the sampling circuit 5, the sampling circuit 6, and the sampling circuit 7 may be connected to the multiplexer switch module 1 or the multiplexer switch module 2. FIG. 4 shows that the analog-digital conversion unit 1 and the analog-digital conversion unit 2 correspond to one multiplexer switch module respectively as an example for description. If the analog-digital conversion unit 1 corresponds to a plurality of (at least two) multiplexer switch modules, the sampling circuit 5, the sampling circuit 6, and the sampling circuit 7 may not be connected only to at least two of the plurality of (at least two) multiplexer switch modules corresponding to the analog-digital conversion unit 1. In FIG. 4, the sampling circuit 5 is connected to the multiplexer switch module 1, and the sampling circuit 6 and the sampling circuit 7 are connected to the multiplexer switch module 2, so that at least two analog-digital conversion units sample all sampling circuits of the non-special monitoring point 3. In this way, on one hand, the risk of failures may be reduced, and on the other, sampling using different analog-digital conversion units is favorable for ensuring independence in sampling by the analog-digital conversion units and independence in processing sample data, and the analog-digital conversion units and the sample data processing may verify each other.

In addition, in this disclosure, each of the multiplexer switch modules further includes a power port for connecting the power supply VDD (i.e., the power supply VDD in the detection circuit), and a grounding port for grounding. After receiving a voltage converted by the analog-digital conversion unit, the processing unit further determines whether the converted voltage exceeds a preset range. After determining that the converted voltage exceeds the preset range, the processing unit further samples the voltage at the power port and the voltage at the grounding port, and compares the converted voltage with the voltage at the power port and with the voltage at the ground port, respectively, so as to determine whether a preset fault occurs to a corresponding sampling circuit, the preset fault including a short-circuited power supply fault and a grounding short-circuit fault. If the converted voltage is equal to the voltage at the power port, it is determined that a short-circuited power supply fault occurs to the sampling circuit. If the converted voltage is equal to the voltage at the grounding port, it is determined that a grounding short-circuit fault occurs to the sampling circuit. It is worth mentioning that in practical applications, as long as the difference between the converted voltage and the voltage at the power supply port (or the voltage at the grounding port) is within an error range allowed, the two may be considered equal. After determining that a preset fault occurs to the sampling circuit, the processing unit may send a notification message to warn a person involved to deal with the fault.

It shall be noted that, in practical applications, a multiplexer unit may be directly disposed in the control module to replace the multiplexer switch module in this disclosure. Similar to the multiplexer switch module, each input port of the multiplexer unit may be correspondingly connected to one sampling circuit. For a special monitoring point, it shall be ensured that each sampling circuit of the special monitoring point is connected to at least two multiplexer units, and that each of the connected multiplexer units corresponds to an independent analog-digital conversion unit. For any temperature monitoring point except the special monitoring point, the multiplexer units connected to its all sampling circuits corresponding to the temperature monitoring point may at least correspond to two independent analog-digital conversion units. The analog-digital conversion unit may sample voltages at output terminals of the sampling circuits through the multiplexer units to acquire temperatures at the temperature monitoring points.

Those skilled in the art shall appreciate that the above described embodiments are specific embodiments for implementing the present disclosure. In practice, however, many changes may be made in the forms and details of the specific embodiments without departing from the scope of the disclosure.

What is claimed is:

1. A battery pack temperature detection system, comprising:
    a battery pack, disposed with a plurality of temperature monitoring points; the plurality of temperature monitoring points at least comprise a temperature monitoring point at a positive electrode of the battery pack, a temperature monitoring point at a negative electrode of the battery pack and a temperature monitoring point/points in a region between the positive electrode and the negative electrode;
    a plurality of sampling circuits, wherein each temperature monitoring point is disposed with at least two of the plurality of sampling circuits to achieve a redundancy design, and the at least two of the plurality of sampling circuits disposed for one temperature monitoring point are different sampling circuits;
    a control module configured to:
        acquire temperature data of each temperature monitoring point by each of the disposed sampling circuits, and
determine a current temperature of the battery pack according to the temperature data to determine whether the temperature of the battery pack exceeds a preset value;
    wherein there is at least one special monitoring point among the plurality of temperature monitoring points, each sampling circuit of the special monitoring point/points is connected with at least two analog-digital conversion units in the control module;
    wherein all sampling circuits of any non-special monitoring point are connected with at least two analog-digital conversion units in the control module; and
    wherein the non-special monitoring point refers to any temperature monitoring point among the temperature monitoring points except the special monitoring point/points.

2. The battery pack temperature detection system according to claim 1, wherein the sampling circuit comprises a temperature sensor disposed at a temperature monitoring point and a detection circuit connected with the temperature sensor; and
    wherein a difference between the sampling circuits is that at least one of a type of the temperature sensor, a connection relationship between the temperature sensor and the detection circuit, and the detection circuit is different.

3. The battery pack temperature detection system according to claim 2, wherein the detection circuit comprises a power supply, a voltage divider unit, a filter resistor and a filter capacitor;
    wherein a connection relationship between the temperature sensor and the detection circuit specifically is: one terminal of the voltage divider unit and one terminal of the filter resistor are connected together and further connected to a first connecting terminal of the temperature sensor; the other terminal of the voltage divider unit is connected to the power supply, the other terminal of the filter resistor and one terminal of the filter capacitor are connected together as an output terminal of the sampling circuit, and the other terminal of the filter capacitor and a second connecting terminal of the temperature sensor are connected together and grounded;
    or, a connection relationship between the temperature sensor and the detection circuit specifically is: one terminal of the voltage divider unit and one terminal of the filter resistor are connected together and further connected to the first connecting terminal of the temperature sensor, and a second connecting terminal of the temperature sensor is connected to the power supply; the other terminal of the filter resistor and one terminal of the filter capacitor are connected together as an output terminal of the sampling circuit; the other terminal of the filter capacitor and the other terminal of the voltage divider unit are connected together and grounded;
    and wherein the control module is configured to calculate a temperature of each of the temperature monitoring points by sampling voltages of output terminals of the plurality of sampling circuits.

4. The battery pack temperature detection system according to claim 1, wherein the system further comprises: a multiplexer switch module, and the control module is configured to connect the plurality of the sampling circuits via the multiplexer switch module; and
    wherein the multiplexer switch module comprises a plurality of input ports, and each of the sampling circuits is correspondingly connected to one of the input ports.

5. The battery pack temperature detection system according to claim 4, wherein there are at least two multiplexer switch modules;
    wherein each sampling circuit of the special monitoring point/points is connected with the at least two multiplexer switch modules, and the at least two multiplexer switch modules connecting with each sampling circuit of the special monitoring point/points correspond to different analog-digital conversion units respectively; and
    wherein all sampling circuits of any non-special monitoring point are connected with at least two multiplexer switch modules, and the at least two multiplexer switch modules connecting with all sampling circuits of the non-special monitoring point correspond to at least two analog-digital conversion units.

6. The battery pack temperature detection system according to claim 4, wherein the multiplexer switch module further comprises a power supply port for connecting the power supply, and a grounding port for grounding; and
    wherein the control module is configured to, when a voltage of the output terminal of the sampling circuit exceeds a preset range, compare the voltage at the output terminal of the sampling circuit with a voltage of the grounding port and a voltage of the power supply port of the multiplexer switch module corresponding to the sampling circuit, to determine whether a preset fault exists in the sampling circuit.

7. The battery pack temperature detection system according to claim 1, wherein the control module further comprises a processing unit;

wherein the analog-digital conversion unit is configured to convert a voltage at an output terminal of the sampling circuit currently performing sampling, and send a converted voltage to the processing unit;

wherein the processing unit is configured to obtain a temperature data at a temperature monitoring point corresponding to the sampling circuit currently performing sampling, according to the converted voltage correspondingly;

and the processing unit is further configured to, upon acquiring temperature data of all of the temperature monitoring points, select from the temperature data of all of the temperature monitoring points the highest temperature data as a temperature of the battery pack.

8. The battery pack temperature detection system according to claim 7, wherein the processing unit is configured to search a pre-stored table for the temperature data corresponding to the converted voltage, and when found, serve the temperature data as the temperature data at the temperature monitoring point corresponding to the sampling circuit currently performing sampling.

9. The battery pack temperature detection system according to claim 7, wherein the processing unit is configured to initiate a corresponding alarming solution according to an interval in which a difference between the temperature of the battery pack and the preset value falls when the temperature of the battery pack exceeds the preset value.

10. The battery pack temperature detection system according to claim 1, wherein the plurality of temperature monitoring points comprise at least two temperature monitoring points at a positive electrode of the battery pack, a temperature monitoring point at a negative electrode of the battery pack and a temperature monitoring point/points in a region between the positive electrode and the negative electrode.

* * * * *